United States Patent
Sohn et al.

(10) Patent No.: US 8,254,201 B2
(45) Date of Patent: Aug. 28, 2012

(54) SEMICONDUCTOR MEMORY DEVICE HAVING POWER-SAVING EFFECT

(75) Inventors: Young-Soo Sohn, Seoul (KR); Kwang-Il Park, Yongin-si (KR); Kyoung-Ho Kim, Hwaseong-si (KR); Seung-Jun Bae, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 216 days.

(21) Appl. No.: 12/797,791

(22) Filed: Jun. 10, 2010

(65) Prior Publication Data

US 2010/0329041 A1    Dec. 30, 2010

(30) Foreign Application Priority Data

Jun. 30, 2009  (KR) .................. 10-2009-0058915

(51) Int. Cl.
*G11C 8/18*    (2006.01)
*G11C 7/10*    (2006.01)

(52) U.S. Cl. ................ 365/233.1; 365/189.05
(58) Field of Classification Search ........... 365/233.1, 365/233.16, 233.17, 189.05
See application file for complete search history.

(56) References Cited

U.S. PATENT DOCUMENTS

| | | | | |
|---|---|---|---|---|
| 5,568,445 A | * | 10/1996 | Park et al. .................. | 365/233.1 |
| 8,040,747 B2 | * | 10/2011 | Hwang ......................... | 365/203 |
| 2003/0198098 A1 | * | 10/2003 | Fujioka et al. ............... | 365/200 |
| 2010/0165769 A1 | * | 7/2010 | Kuroki ......................... | 365/203 |

FOREIGN PATENT DOCUMENTS

| | | |
|---|---|---|
| JP | 11-016350 | 1/1999 |
| JP | 2006-287552 | 10/2006 |
| KR | 1020010048989 | 6/2001 |
| KR | 1020020050086 | 6/2002 |

* cited by examiner

*Primary Examiner* — Anh Phung
(74) *Attorney, Agent, or Firm* — F. Chau & Associates, LLC

(57) ABSTRACT

A semiconductor memory device includes a memory cell array, a controller, and a data input/output (I/O) unit. The memory cell array includes a plurality of memory cells and is configured to store data. The controller is configured to enable a write clock signal in response to an active command when a write latency of the semiconductor device is less than a reference write latency and disable the write clock signal during a disabling period in which read data is output from the semiconductor device. The data I/O unit is configured to receive data in response to the write clock signal and output the data to the memory cell array.

20 Claims, 4 Drawing Sheets

SEMICONDUCTOR MEMORY DEVICE HAVING POWER-SAVING EFFECT

CROSS-REFERENCE TO RELATED APPLICATION

This application claims priority under 35 U.S.C. §119 to Korean Patent Application No. 10-2009-0058915, filed on Jun. 30, 2009, the disclosure of which is incorporated by reference in its entirety herein.

BACKGROUND

1. Technical Field

Exemplary embodiments of the inventive concept relate to a semiconductor memory device, and more particularly, to a semiconductor memory device that is configured to save power.

2. Discussion of Related Art

The time taken to output data after a read command is applied to a semiconductor memory device may be referred to as read latency and the time taken to receive external data after a write command is applied to the semiconductor device may be referred to as write latency. The read latency and the write latency may be expressed by a predetermined number of clock periods. In a semiconductor memory device, after the read latency is set to a predetermined value, the write latency may be defaulted to be equal to the read latency. A read operation of the semiconductor memory may involve decoding an address applied along with a read command, selecting a memory cell corresponding to the address, sensing data of the selected memory cell, and externally outputting the sensed data. Thus, the read operation may require a minimum latency of, for example, four clock periods. Accordingly, the read latency cannot be set to fewer clock periods (e.g., two clock periods) than the minimum latency. In contrast, during a write operation, the semiconductor memory device may receive external data as soon as a write command is applied. Accordingly, the write latency may be set to a smaller number of clocks (e.g., two clocks) relative to the read latency. Accordingly, the efficiency of the semiconductor memory may be reduced when the write latency is equated to the read latency, especially in high-speed semiconductor memory devices.

However, when the write latency is set to a small value (e.g., three clocks or less), it may be difficult to synchronize the write clock signal with an external clock signal and generate a stable write clock signal until the semiconductor memory device externally receives the data. When the write clock signal is not stabile, the semiconductor memory device may malfunction.

A semiconductor device may maintain a write clock signal to be continuously enabled during an active mode when the write latency is set to a small value to reduce malfunctions. However, when the write clock signal is maintained in this manner, the semiconductor memory device uses more power.

SUMMARY

At least one exemplary embodiment of the inventive concept includes a semiconductor memory device that disables a write clock signal and an input buffer during a read-data output period to reduce power use.

According to an exemplary embodiment of the inventive concept, a semiconductor memory device includes a memory cell array, a controller, and a data input/output (I/O) unit. The memory cell array includes a plurality of memory cells and stores data. The controller enables a write clock signal in response to an active command when a write latency is less than a reference write latency, and disables the write clock signal during a period in which read data is externally output. The read data may be output in response to a read command and a read latency of the semiconductor memory device. The data I/O unit externally receives data in response to the write clock signal and outputs the data to the memory cell array.

The disabling period of the write clock signal may extend from a time point which is earlier by a first clock time than a time point when the read data is externally output to a time point which is later by a second clock time than a time point when the read data is externally output. For example, the disabling period of the write clock signal may extend from a start time before the read data is output, to an end time after the read data is output.

The controller may include a command decoder, a mode-setting unit, a latency controller, and a clock generator. The command decoder may decode an externally applied command and output the active command, the read command, a write command, and a mode-setting command. The mode-setting unit may store the read latency, the write latency, and a burst length that are externally applied in response to the mode-setting command. The latency controller may enable a read clock enable signal and a write clock disable signal in response to the read command, the read latency, and the burst length and enable a write clock enable signal in response to the active command, the write command, the write latency, and the burst length. The clock generator may enable a read clock signal in response to the read clock enable signal, enable a write clock signal in response to the write clock enable signal, and disable the write clock signal in response to the write clock disable signal.

The latency controller may enable the write clock enable signal in response to the active command when the write latency is less than the reference write latency, and enable the write clock enable signal during a period corresponding to the sum of the write latency and the burst length in response to the write command when the write latency is greater than the reference write latency.

The first clock time may be shorter than a clock time designated by the read latency, and the second clock time may be shorter than a clock time designated by the write latency.

The latency controller may enable the read clock enable signal during a period corresponding to the sum of the read latency and the burst length in response to the read command.

The latency controller may enable the write clock disable signal in response to the read command from a time point which is earlier by the first clock time than a time designated by the read latency, to a time point which is later by the second clock time than a time corresponding to the burst length.

The clock generator may include a write clock generator and a read clock generator. The write clock generator may generate the write clock signal being enabled in response to the write clock enable signal and disabled in response to the write clock disable signal. The read clock generator may generate the read clock signal being enabled in response to the read clock enable signal. The read and write clock signals may be synchronized with an external clock signal.

The data I/O unit may include an input buffer unit and an output buffer unit. The input buffer unit may include a plurality of input buffers. Each of the input buffers may buffer input data applied from a corresponding I/O terminal in response to the write clock signal and output the buffered data to the memory cell array. The output buffer unit may include a plurality of output buffers. Each of the output buffers may buffer output data applied from the memory cell array in response to the read clock signal and output the buffered output data to the corresponding I/O terminal.

A semiconductor memory device according to an exemplary embodiment of the inventive concept includes a memory cell array including a plurality of memory cells, a controller, and a data input/output (I/O) unit configured to receive data in response to a write clock signal and output the data to the memory cell array. The controller is configured set a write clock enable signal to an activated level in response to an active command to enable a write clock signal. The controller is further configured to maintain a write clock disable signal at a deactivated level until a read command is received and a first period of time afterward elapses that is less than a read latency of the semiconductor memory device, and thereafter maintain the write clock disable signal at an activated level until an output of data from the semiconductor memory device has completed and a second period of time afterward elapses to disable the write clock signal.

The controller may set the write clock enable signal to an activated level only if a current write latency of the semiconductor device is less than a reference latency. The current write latency may be less than the read latency. The data may be output from the semiconductor memory device in response to the read command and the read latency. The controller may include a command decoder, a mode-setting unit, a latency controller, and a clock generator. The command decoder may be configured to decode a command and output the active command, the read command, and a write command. The mode-setting unit may be configured to store the read latency and the write latency. The latency controller may be configured to receive the read latency and the write latency from the mode-setting unit and receive the active command, the read command, and the write command from the command decoder to generate a read clock enable signal, the write clock disable signal, and the write clock enable signal. The clock generator may be configured to enable a read clock signal in response to the read clock enable signal, generate the write clock signal in response to the write clock enable signal, and disable the write clock signal in response to the write clock disable signal.

A semiconductor memory device according to an exemplary embodiment of the inventive concept includes a memory cell array, a controller, and a data input/output (I/O) unit configured to receive data in response to a write clock signal and output the data to the memory cell array. The controller is configured to enable a write clock enable signal in response to an active command when a write latency is less than a reference write latency. The controller is configured to enable the write clock enable signal during a period corresponding to a sum of the write latency and a burst length in response to a write command when the write latency is greater than the reference write latency. The controller is configured to disable the write clock signal during a disabling period in which read data is output from the semiconductor device in response to a read command and a read latency of the semiconductor device.

The controller may include a read clock generator configured to generate a read clock signal being enabled in response to a read clock enable signal and a write clock generator configured to generate the write clock signal being enabled in response to a write clock enable signal and disabled in response to a write clock disable signal. The disabling period may be a sum of a first time period, the burst length, and a second time period. The first time period may be less than the read latency and the second time period may be a period between when the read clock is disabled and when the read clock enable signal is disabled. The read clock signal and the write clock signal may be both clocked in synchronization with a same external clock signal.

BRIEF DESCRIPTION OF THE DRAWINGS

Exemplary embodiments of the inventive concept are described in further detail below with reference to the accompanying drawings.

DETAILED DESCRIPTION OF EXEMPLARY EMBODIMENTS

The inventive concept will now be described more fully with reference to the accompanying drawings in which exemplary embodiments thereof are shown.

Figure 1:
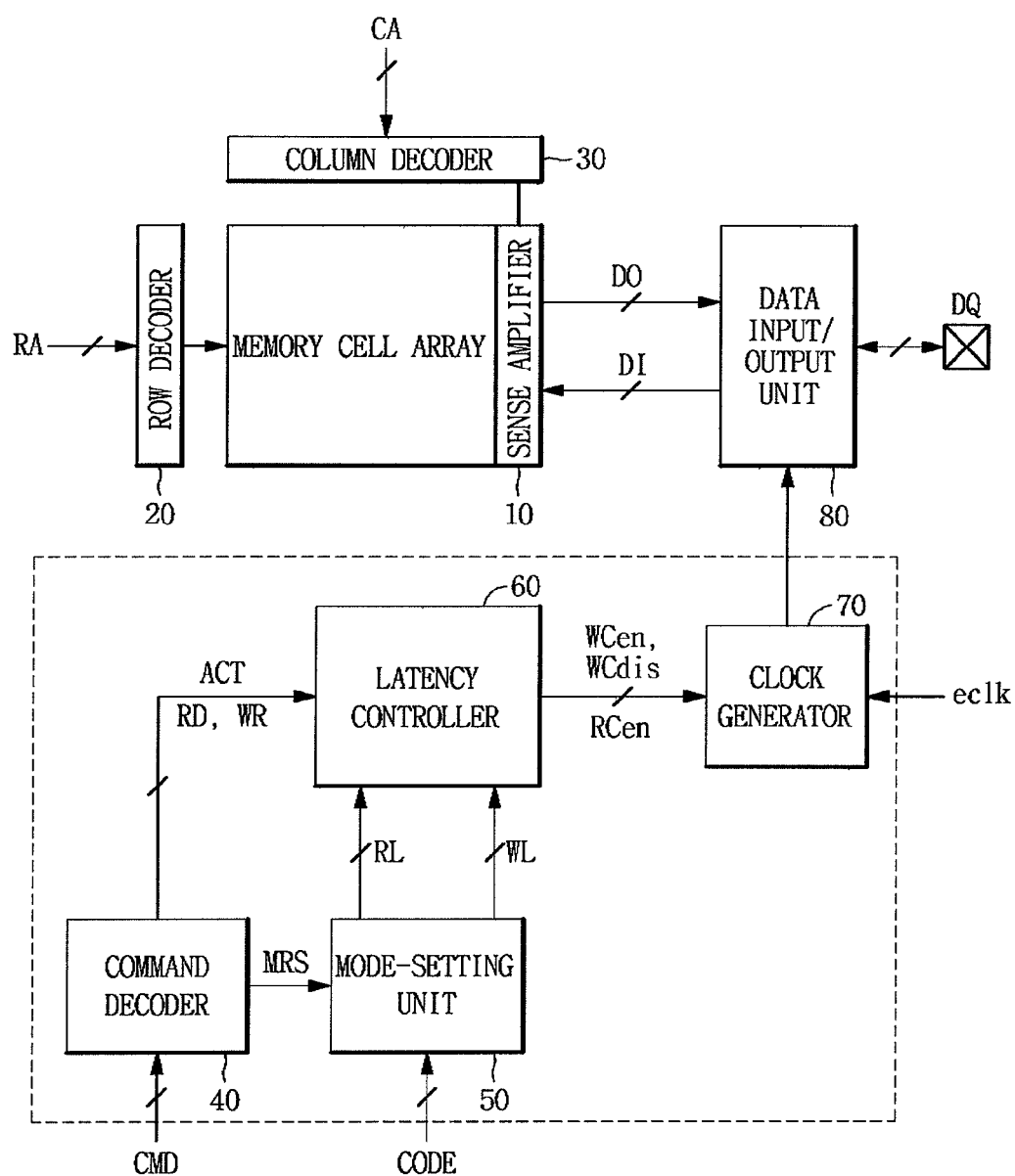
FIG. 1 is a diagram of a semiconductor memory device according to an exemplary embodiment of the inventive concept.

FIG. 1 is a diagram of a semiconductor memory device according to an exemplary embodiment of the inventive concept. Referring to FIG. 1, the semiconductor memory device may include a memory cell array 10, a row decoder 20, a column decoder 30, a command decoder 40, a mode-setting unit 50, a latency controller 60, a clock generator 70, and a data input/output (I/O) unit 80.

The memory cell array 10 may include a plurality of memory cells interposed between a plurality of word lines and a plurality of bit lines to store data. The row decoder 20 may receive a row address RA, decode the row address RA, and enable a word line of the plurality of word lines of the memory cell array 10 corresponding to the decoded row address RA. The row address RA may be received from externally supplied addresses.

The memory cell 10 may further include a sense amplification unit including a plurality of sense amplifiers. The plurality of sense amplifiers may sense and amplify data applied from memory cells connected to the enabled word line.

The column decoder 30 may receive a column address CA, decode the column address CA, and select a sense amplifier of the plurality of sense amplifiers corresponding to the decoded column address CA. The selected sense amplifier may output amplified data to the data I/O unit 80 or store data received from the data I/O unit 80 in an enabled memory cell. The column address CA may be received from externally supplied addresses.

The command decoder 40 may receive an external command COM, decode the external command COM, output an active command ACT, a read command RD, and a write command WR, and output a mode register set (MRS) command to the mode-setting unit 50. The mode-setting unit 50 may receive a mode-setting code CODE in response to the MRS command and store various settings of the semiconductor memory device. The mode-setting CODE may be externally supplied in an address or data format. The mode-setting code CODE may include read latency RL, a write latency WL, a reference write latency, and a burst length.

The latency controller 60 may receive the active command ACT, the read command RD, and the write command WR from the command decoder 40 and output a read clock enable signal RCen, a write clock enable signal WCen, and a write clock disable signal WCdis to the clock generator 70 in response to the read latency RL and the write latency WL set by the mode-setting unit 50.

The read clock enable signal RCen may be enabled in response to the application of the read command RD, maintained during a period corresponding to the read latency RL, and then disabled. An operation of the write clock enable signal WCen may be divided such that the write latency WL is set to a value equal to or greater than a designated value (e.g., 4 clocks) or such that the write latency WL is set to a value smaller than the designated value. When the write latency WL is set to the value equal to or greater than the designated value, the write clock enable signal WCen may be enabled in response to the application of the write command WR, maintained during a period corresponding to the write latency WL, and then disabled. When the write latency WL is set to the value smaller than the designated value, the write clock enable signal WCen may be continuously enabled during an enabling period of the active command ACT.

Since the read latency RL and the write latency WL respectively designate a time point when the semiconductor memory device starts to externally output the data and a time point when the semiconductor memory device starts to externally receive data, when the read clock enable signal RCen and the write clock enable signal WCen are respectively maintained for the read latency RL and the write latency WL and then disabled, actual data may be neither received nor output. Thus, after the read clock enable signal RCen and the write clock enable signal WCen are respectively maintained for the read latency RL and the write latency WL, the read clock enable signal RCen and the write clock enable signal WCen may be further delayed for a time corresponding to a data length and then disabled. The data length may be set to one or more clock periods.

When the write latency WL is set to a value smaller than a designated value, the write clock disable signal WCdis may disable a write clock signal to prevent the write clock signal from being unnecessarily clocked in response to the write clock enable signal WCen, which is continuously enabled during the enabling period of the active command ACT. The write clock disable signal WCdis may be enabled after a time the read command RD is applied plus a time that is less than the read latency (e.g., the read latency minus one clock period). For example, if the read command RD is applied at time T1, and the read latency is 4 clock periods, the write clock disable signal WCdis could be enabled at T1+3 clock periods. The write clock disable signal WCdis may be disabled simultaneously when the read clock enable signal RCen is disabled or disabled a predetermined number of clock periods (e.g., one clock) after the read clock enable signal RCen is disabled. To perform a read operation, the write clock disable signal WCdis may be enabled from a start time before the semiconductor memory device externally outputs data to an end time after which the semiconductor memory device externally outputs the data. Here, the start and end times may have been previously set. Although the write clock disable signal WCdis functions to disable the write clock signal as described above, the write clock disable signal WCdis may be enabled or disabled in response to the read command RD and the read latency RL.

Although the read clock enable signal RCen and the write clock enable signal WCen are disabled after time periods corresponding to the read latency RL and the write latency WL, respectively, when the semiconductor memory device supports a burst read and a burst write, enabling periods of the read clock enable signal RCen and the write clock enable signal WCen may be further extended for a time corresponding to a burst length BL set by the mode-setting unit 50. Like the read latency RL and the write latency WL, the burst length BL may be stored in the mode-setting unit 50, and the latency controller 60 may then receive not only the read latency RL and the write latency WL, but also the burst length BL from the mode-setting unit 50. For example, assuming that each of the read latency RL and the write latency WL is set to four clocks and the burst length BL is set to 4, when the read command RD or the write command WR is applied, the read clock enable signal RCen or the write clock enable signal WCen may be enabled. The read clock enable signal RCen and the write clock enable signal WCen may be enabled for four clock periods corresponding to the read latency RL and the write latency WL, respectively, and then remain enabled while data (e.g., 4 bit) is continuously input or output in response to the burst length BL. Since the burst length BL is set not to the number of clock periods but to the number of continuously output data, the number of clock periods corresponding to the enabling periods of the read clock enable signal RCen and the write clock enable signal WCen, which are extended due to the burst length BL, may depend on the operation of the semiconductor memory device. Also, a semiconductor memory device that cannot designate a burst length BL may operate in the same manner as a semiconductor memory device in which a burst length BL is set to 1.

The clock generator 70 may enable a read clock signal rclk in response to the read clock enable signal RCen, enable a write clock signal wclk in response to the write clock enable signal WCen, and output the enabled signal. However, even if the write clock enable signal WCen is enabled, when the write clock disable signal WCdis is enabled, the clock generator 70 may disable the write clock signal wclk. In other words, the write clock disable signal WCdis may have priority over the write clock enable signal WCen.

The data I/O unit 80 may receive output data DO, which is output by the sense amplification unit, in response to the enabled read clock signal rclk and externally output the output data DO through an I/O terminal DQ. Also, the data I/O unit 80 may externally receive input data DI through the I/O terminal DQ and output the input data DI to the memory cell array 10.

FIG. 1 illustrates only one I/O terminal DQ for brevity, as the semiconductor memory device may include a plurality of I/O terminals DQ. The command decoder 40, the mode-setting unit 50, the latency controller 60, and the clock generator 70 of FIG. 1 may be an example of a controller for controlling the operation of the semiconductor memory device.

Figure 2:
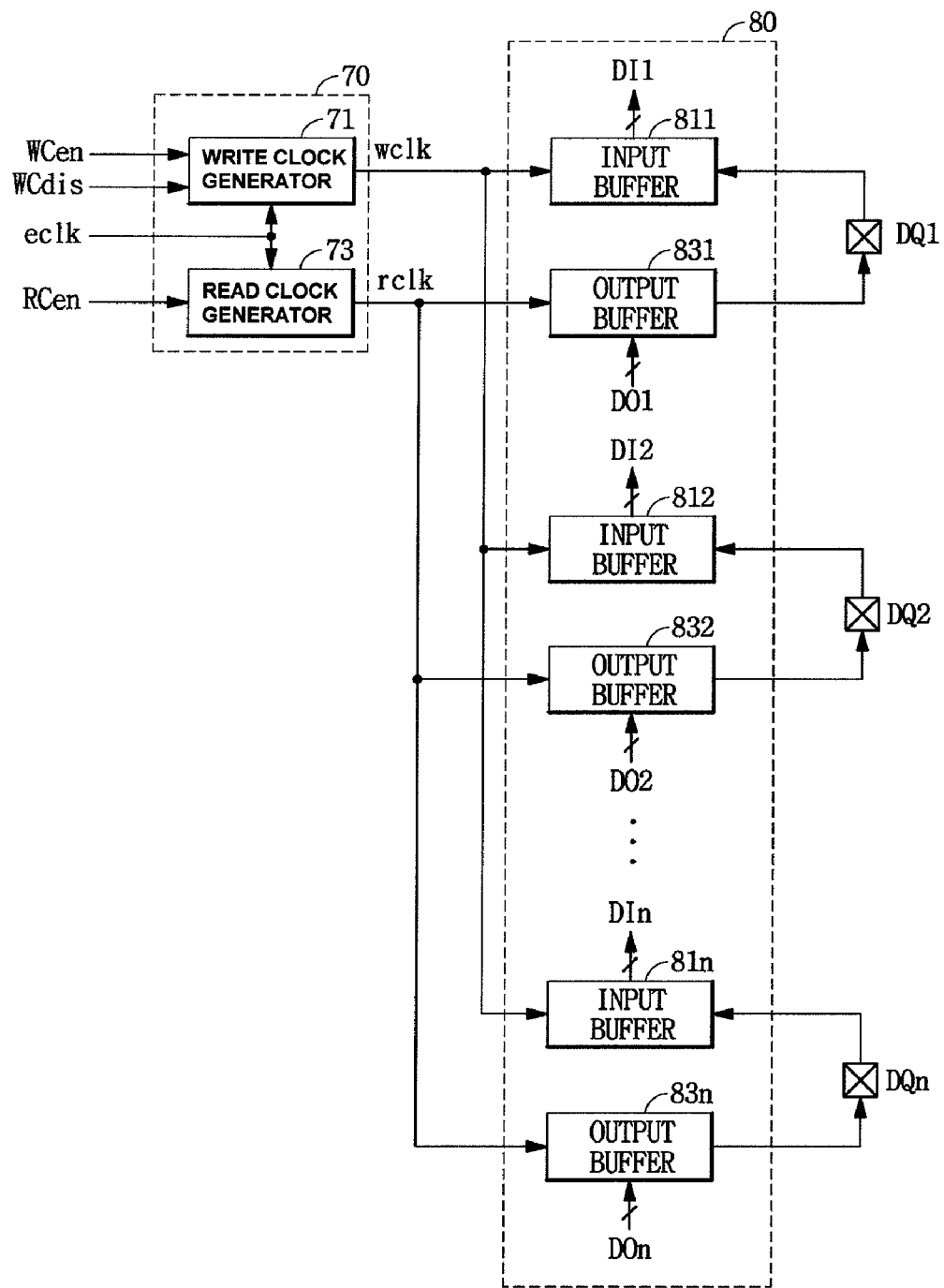
FIG. 2 is a diagram of a clock generator and a data input/output (I/O) unit of FIG. 1, according to an exemplary embodiment of the inventive concept.

FIG. 2 is a diagram of the clock generator and the data I/O unit of FIG. 1, according to an exemplary embodiment of the inventive concept. Referring to FIG. 2, the clock generator 70 may include a write clock generator 71 and a read clock generator 73, and the data I/O unit 80 may include a plurality of input buffers 811 to 81n and a plurality of output buffers 831 to 83n.

The write clock generator 71 may enable the write clock signal wclk in response to the write clock enable signal WCen and disable the write clock signal wclk in response to the write clock disable signal WCdis. The write clock signal wclk may be clocked in synchronization with the external clock signal eclk. For example, the write clock signal wclk may be enabled and clocked in response to the write clock enable signal WCen, and be disabled in response to the write clock disable signal WCdis. The plurality of input buffers 811 to 81n corresponding respectively to a plurality of I/O terminals DQ1 to DQn may buffer data, which is applied through the respectively corresponding I/O terminals DQ1 to DQn, in response to the write clock signal wclk and output the input data DI to the memory cell array 10.

The read clock generator 73 may enable and output the read clock signal rclk, in response to the read clock enable signal RCen. The read clock signal rclk may be clocked in synchronization with the external clock signal eclk. Like the input buffers 811 to 81n, the plurality of output buffers 831 to 83n corresponding respectively to the plurality of I/O terminals DQ1 to DQn may buffer output data DQ, which is applied from the memory cell array 10, in response to the read clock signal rclk and output the buffered output data DO to the respectively corresponding I/O terminals DQ1 to DQn.

The plurality of input buffers 811 to 81n may operate in response to the write clock signal wclk, while the plurality of output buffers 831 to 83n may operate in response to the read clock signal rclk. Thus, when the write clock signal wclk and the read clock signal rclk are disabled, the input and output buffers 811 to 81n and 831 to 83n may not use power. Accordingly, power use may be greatly reduced.

While the plurality of I/O terminals DQ1 to DQn have been described as being used to input and output data, some of the I/O terminals DQ1 to DQn may be used only to input data, and some of the I/O terminals DQ1 to DQn may be used only to output data. When the I/O terminals DQ1 to DQn are used only to input data, the data I/O unit 80 may not include the corresponding output buffers 831 to 83n. In another example, when the I/O terminals DQ1 to DQn are used only to output data, the data I/O unit 80 may not include the corresponding input buffers 811 to 81n.

When a write latency is set to a small value and a semiconductor memory device continuously enables a write clock signal wclk in an active mode, a plurality of input buffers (refer to 811 to 81n of FIG. 2) may perform unnecessary operations in response to the write clock signal wclk, thereby causing an increase in power use of the semiconductor memory device. Further, as shown in FIG. 2, the corresponding input buffers 811 and 81n and output buffers 831 to 83n may be respectively connected to the I/O terminals DQ1 to DQn. Since the input buffers 811 to 81n buffer data even during a read operation of the semiconductor memory device, data output by the output buffers 831 to 83n may be internally applied again to the semiconductor memory device through the input buffers 811 to 81n, thereby potentially causing malfunctions in the semiconductor memory device. Furthermore, FIG. 2 simplifies the configuration of the data I/O unit 80 for brevity, as an actual data I/O unit may include additional I/O paths (not shown), which may further increase power use due to the enabling of the write clock signal wclk.

Figure 3:
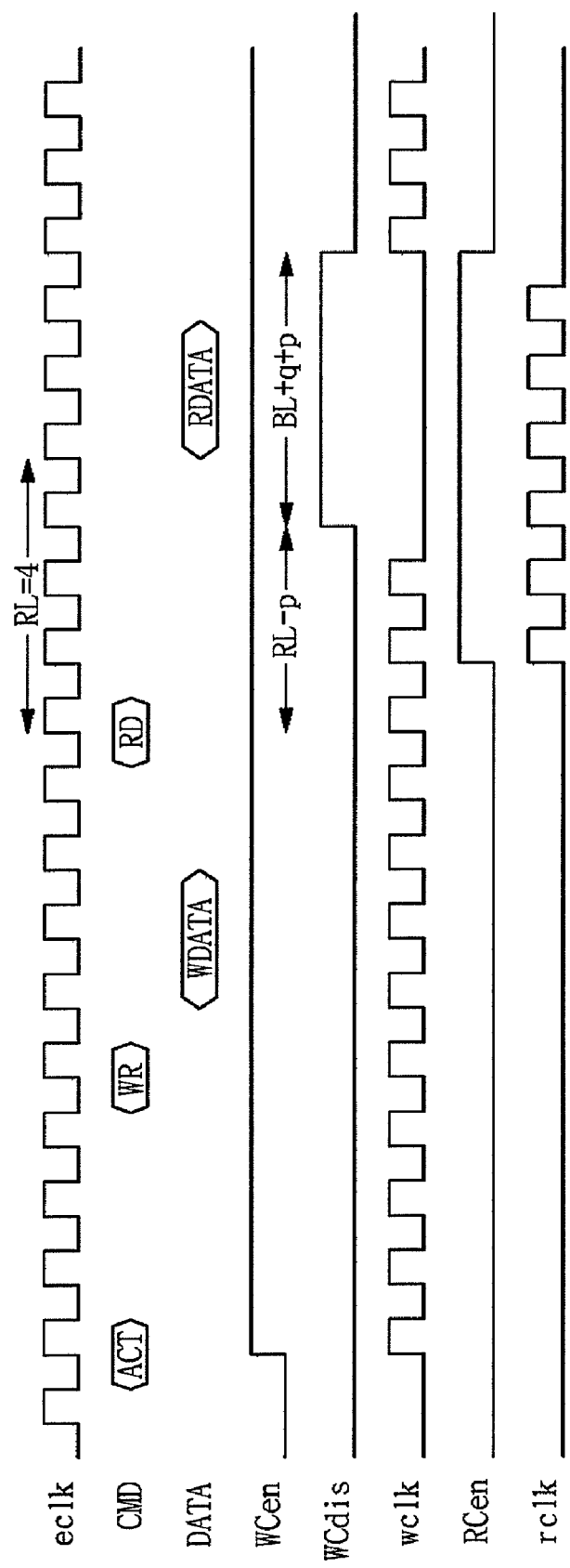
FIG. 3 is a diagram illustrating an exemplary operation of the semiconductor memory device of FIG. 1.

FIG. 3 is a diagram illustrating an exemplary operation of the semiconductor memory device of FIG. 1. In FIG. 3, it is assumed that the read latency RL is four clock period and the write latency WL is one clock period. Further, it is assumed that a reference write latency for determining whether or not the write clock signal wclk is to be continuously enabled in the active mode is four clock periods. Furthermore, it is assumed that the burst length BL is set to 2 and 1-bit data is input or output through the I/O terminal DQ for one clock period. Referring to FIGS. 1 and 2, initially, when an externally applied command CMD is the active command ACT, the semiconductor memory device may enter the active mode. Since the write latency WL set by the mode-setting unit 50 is one clock period, which is smaller than the reference write latency (i.e., four clock periods), the latency controller 60 may enable the write clock enable signal WCen in response to the active command ACT. The write clock generator 71 may enable the write clock signal wclk because the write clock enable signal WCen is enabled and the write clock disable signal WCdis is disabled. The plurality of input buffers 811 to 81n may buffer data, which is applied through the respectively corresponding I/O terminals DQ1 to DQn, in response to the write clock signal wclk.

Afterwards, the command decoder 40 may decode the externally applied command CMD and output the write command WR. However, since the latency controller 60 already enabled the write clock enable signal WCen in response to the active command ACT, the latency controller 60 may not perform any additional operation in response to the write command WR. Further, since the write latency WL is set to one clock period, the input buffers 811 to 81n of the data I/O unit 80 may buffer input data DI applied through the I/O terminal DQ one clock period after the write command WR is generated, and output the buffered input data DI to the memory cell array 10.

When the externally applied command CMD is the read command RD, the command decoder 40 may output the read command RD to the latency controller 60. The latency controller 60 may enable the read clock enable signal RCen in response to the read command RD. Since the read latency RL set by the mode-setting unit 50 is four clocks and the burst length BL is 2, the latency controller 60 may enable the read clock enable signal RCen for six clocks. Also, when the read command RD is applied, the latency controller 60 may enable the write clock disable signal WCdis from a time point which is earlier by a first clock time p than the four clocks corresponding to the read latency RL, and disable the write clock disable signal WCdis from a time point which is later by a second clock time q than a time point when the read clock signal rclk is disabled. The first clock time p may be an integer equal to or greater than 0 and be smaller than the read latency RL, and second clock time q may be an integer equal to or greater than 0 and be smaller than write latency WL. As a result, the write clock disable signal WCdis may be enabled for the number of clock periods corresponding to the sum of the burst length BL, the first clock time p, and the second clock time q (e.g., BL+p+q).

In response to the read clock enable signal RCen, the read clock generator 73 may enable the read clock signal rclk in synchronization with the external clock signal eclk. The read clock signal rclk may be synchronized with the external clock signal eclk and stabilized for a period of the four clocks corresponding to the read latency RL. Thereafter, the read clock generator 73 may receive output data DO from the memory cell array 10 and output the output data DO through the I/O terminal DQ. Also, the write clock generator 71 may disable the write clock signal wclk in response to the write clock disable signal WCdis, and the input buffers 811 to 81n may not perform a buffering operation because the write clock signal wclk is disabled. As a result, in the read operation of the semiconductor memory device, the write clock signal wclk may be disabled and the input buffers 811 to 81n may not perform any operations during the predetermined first and second clock times before and after an output period of the output data DQ. Thus, power use may be reduced.

If the latency controller 60 enables the write clock disable signal WCdis directly after the application of the read command RD, the input buffers 811 to 81n may not receive the input data D1 delayed due to the write latency WL. In other words, since the input data DI may be applied to the input buffers 811 to 81n even after the application of the read command RD, the write clock disable signal WCdis may be enabled for predetermined clock times before and after the output period of the output data DO.

The first and second clock times p and q may be previously defined by the latency controller 60 during a design operation.

Alternatively, the first and second clock times p and q may be stored in the mode-setting unit 50 and transmitted from the mode-setting unit 50 to the latency controller 60.

Figure 4:
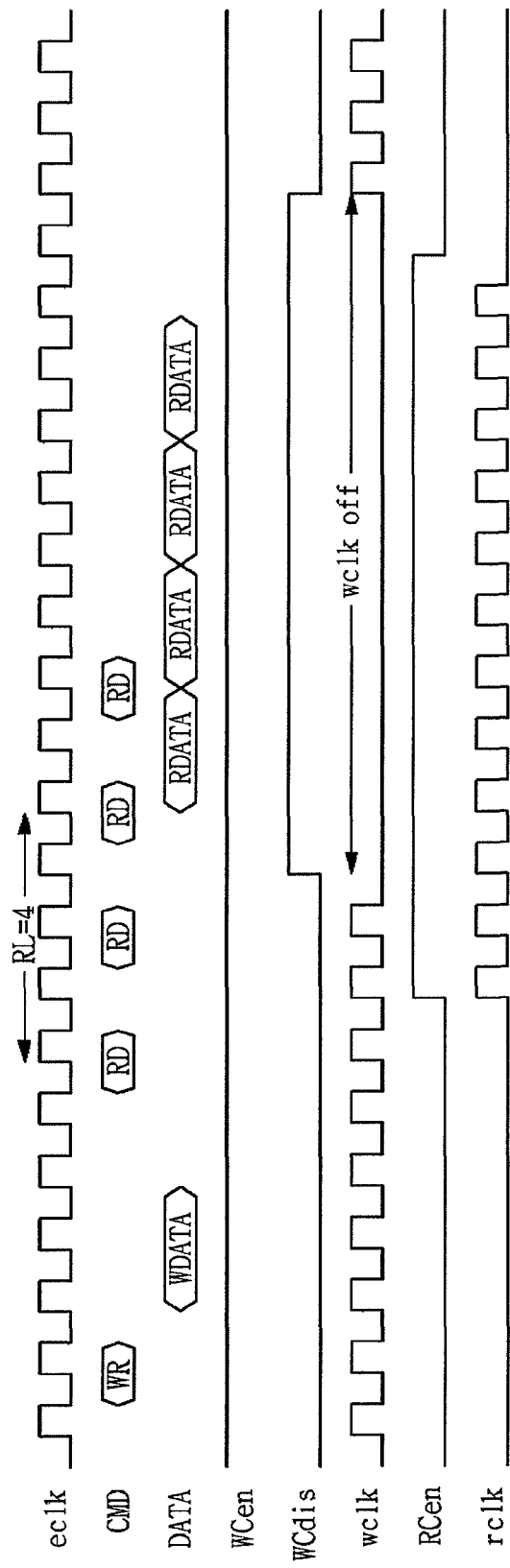
FIG. 4 is a diagram illustrating another exemplary operation of the semiconductor memory device of FIG. 1.

FIG. 4 is a diagram illustrating another exemplary operation of the semiconductor memory device of FIG. 1. As in FIG. 3, it is assumed that the read latency RL is four clock periods, the write latency WL is one clock period, and a reference write latency for determining whether or not the write clock signal wclk is to be continuously enabled in the active mode is four clock periods. Also, it is assumed that the burst length BL is set to 2 and 1-bit data is input and output through the I/O terminal DQ for one clock period.

Referring to FIG. 4, since a write operation of the semiconductor memory device is the same as in FIG. 3, a description thereof will be omitted. However, unlike in FIG. 3, a read command RD may be continuously applied during a read operation. In other words, the semiconductor memory device may perform a gapless read operation. Since the burst length BL is set to 2, when the read command RD is continuously applied once at intervals of two clock periods, the semiconductor memory device may perform the gapless read operation. When the read command RD is continuously applied once at the intervals of two clock periods, the latency controller 60 may enable the read clock enable signal RCen for six clock periods in response to the previously applied read command RD because the read latency RL is set to four clock periods and the burst length BL is 2. Subsequently, since the read command RD is continuously applied once at the intervals of two clock periods, enabling periods of the read clock enable signal RCen corresponding to respective read commands RD may be adjacent to one another. As a result, the enabling period of the read clock enable signal RCen may be extended for 2 clock periods in response to the continuously applied read command RD.

Furthermore, when the read command RD is applied, the write clock disable signal WCdis may be enabled from a time point which is earlier by a first clock time p than the number of clock periods corresponding to the read latency RL, and the write clock disable signal WCdis may be disabled from a time point which is later by a second clock time q than a time point when the read clock signal rclk is disabled. The first clock time p may be an integer equal to or greater than 0 and smaller than the read latency RL, and the second clock time q may be an integer equal to or greater than 0. Since the read command RD is continuously applied, enabling periods of the write clock disable signal WCdis may be adjacent to one another. Accordingly, the enabling period of the write clock disable signal WCdis may also be extended for two clock periods in response to the continuously applied read command RD. Therefore, the disabling period of the write clock signal wclk may be extended, thereby greatly reducing power use.

Although FIGS. 1 and 2 illustrate that the clock generator 70 includes the write clock generator 71 and the read clock generator 73, the clock generator 70 may include a single clock generator and further include a switch to separately output the read clock signal rclk and the write clock signal wclk.

Furthermore, it is described that the input buffers 811 to 81n and the output buffers 831 to 83n may perform buffering operations only in response to the write clock signal wclk and the read clock signal rclk, respectively. However, the input buffers 811 to 81n and the output buffers 831 to 83n may be enabled in response to the read clock enable signal RCen and the write clock enable signal WCen and disabled in response to the write clock disable signal WCdis.

As described above, when a write latency is set to a small value, a semiconductor memory device according to at least one exemplary embodiment of the inventive concept can disable a write clock signal and an input buffer during a read-data output period, thereby reducing power use.

Having described exemplary embodiments of the inventive concept, those skilled in the art will appreciate that many modifications can be made in the exemplary embodiments without materially departing from the disclosure. Accordingly, all such modifications are intended to be included within the scope of the disclosure.

What is claimed is:

1. A semiconductor memory device comprising:
   a memory cell array including a plurality of memory cells and configured to store data;
   a controller configured to enable a write clock signal in response to an active command when a write latency of the semiconductor device is less than a reference write latency and disable the write clock signal during a disabling period in which read data is externally output from the semiconductor device; and
   a data input/output (I/O) unit configured to externally receive data in response to the write clock signal and output the data to the memory cell array.

2. The device of claim 1, wherein the read data is output from the semiconductor memory device in response to a read command and a read latency of the semiconductor device.

3. The device of claim 2, wherein the disabling period of the write clock signal extends from a start time before the read data is externally output, to an end time after the read data is externally output.

4. The device of claim 3, wherein the controller comprises:
   a command decoder configured to decode an externally applied command and output the active command, the read command, a write command, and a mode-setting command;
   a mode-setting unit configured to store the read latency, the write latency, and a burst length that are externally applied in response to the mode-setting command;
   a latency controller configured to enable a read clock enable signal and a write clock disable signal in response to the read command, the read latency, and the burst length and enable a write clock enable signal in response to the active command, the write command, the write latency, and the burst length;
   a clock generator configured to enable a read clock signal in response to the read clock enable signal, enable a write clock signal in response to the write clock enable signal, and disable the write clock signal in response to the write clock disable signal.

5. The device of claim 4, wherein the latency controller enables the write clock enable signal in response to the active command when the write latency is less than the reference write latency, and enables the write clock enable signal during a period corresponding to the sum of the write latency and the burst length in response to the write command when the write latency is greater than the reference write latency.

6. The device of claim 4, wherein the first clock time is shorter than a clock time designated by the read latency, and the second clock time is shorter than a clock time designated by the write latency.

7. The device of claim 4, wherein the latency controller enables the read clock enable signal during a period corresponding to the sum of the read latency and the burst length in response to the read command.

8. The device of claim 7, wherein the latency controller enables the write clock disable signal in response to the read command from a time point which is earlier by the first clock time than a time designated by the read latency, and a time point which is later by the second clock time than a time corresponding to the burst length.

9. The device of claim 4, wherein the clock generator comprises:
a write clock generator configured to generate the write clock signal being enabled in response to the write clock enable signal and disabled in response to the write clock disable signal; and
a read clock generator configured to generate the read clock signal being enabled in response to the read clock enable signal.

10. The device of claim 9, wherein the read and write clock signals are synchronized with an external clock signal.

11. The device of claim 1, wherein the data I/O unit comprises:
an input buffer unit including a plurality of input buffers, each input buffer configured to buffer input data applied from a corresponding I/O terminal in response to the write clock signal and output the buffered data to the memory cell array; and
an output buffer unit including a plurality of output buffers, each output buffer configured to buffer output data applied from the memory cell array in response to the read clock signal and output the buffered output data to the corresponding I/O terminal.

12. A semiconductor memory device comprising:
a memory cell array including a plurality of memory cells;
a controller; and
a data input/output (I/O) unit configured to receive data in response to a write clock signal and output the data to the memory cell array,
wherein the controller is configured set a write clock enable signal to an activated level in response to an active command to enable a write clock signal, and
wherein the controller is configured to maintain a write clock disable signal at a deactivated level until a read command is received and a first period of time afterward elapses that is less than a read latency of the semiconductor memory device, and thereafter maintain the write clock disable signal at an activated level until an output of data from the semiconductor memory device has completed and a second period of time afterward elapses to disable the write clock signal.

13. The device of claim 12, wherein the controller sets the write clock enable signal to an activated level only if a current write latency of the semiconductor device is less than a reference latency.

14. The device of claim 13, wherein the current write latency is less than the read latency.

15. The device of claim 12, wherein the data is output from the semiconductor memory device in response to the read command and the read latency.

16. The device of claim 12, wherein the controller comprises:

a command decoder configured to decode a command and output the active command, the read command, and a write command;
a mode-setting unit configured to store the read latency and the write latency;
a latency controller configured to receive the read latency and the write latency from the mode-setting unit and receive the active command, the read command, and the write command from the command decoder to generate a read clock enable signal, the write clock disable signal, and the write clock enable signal;
a clock generator configured to enable a read clock signal in response to the read clock enable signal, generate the write clock signal in response to the write clock enable signal, and disable the write clock signal in response to the write clock disable signal.

17. A semiconductor memory device comprising:
a memory cell array;
a controller; and
a data input/output (I/O) unit configured to receive data in response to a write clock signal and output the data to the memory cell array,
wherein the controller is configured to enable a write clock enable signal in response to an active command when a write latency is less than a reference write latency,
wherein the controller is configured to enable the write clock enable signal during a period corresponding to a sum of the write latency and a burst length in response to a write command when the write latency is greater than the reference write latency, and
wherein the controller is configured to disable the write clock signal during a disabling period in which read data is output from the semiconductor device in response to a read command and a read latency of the semiconductor device.

18. The device of claim 17, wherein the controller comprises:
a read clock generator configured to generate a read clock signal being enabled in response to a read clock enable signal; and
a write clock generator configured to generate the write clock signal being enabled in response to a write clock enable signal and disabled in response to a write clock disable signal.

19. The device of claim 18, wherein the disabling period is a sum of a first time period, the burst length, and a second time period, wherein the first time period is less than the read latency, and the second time period is a period between when the read clock is disabled and when the read clock enable signal is disabled.

20. The device of claim 18, wherein the read clock signal and the write clock signal are both clocked in synchronization with a same external clock signal.

* * * * *